(12) United States Patent
Erickson et al.

(10) Patent No.: US 8,492,207 B2
(45) Date of Patent: Jul. 23, 2013

(54) IMPLEMENTING EFUSE CIRCUIT WITH ENHANCED EFUSE BLOW OPERATION

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 13/091,259

(22) Filed: Apr. 21, 2011

(65) Prior Publication Data

US 2012/0268195 A1  Oct. 25, 2012

(51) Int. Cl.
*H01L 21/762* (2006.01)

(52) U.S. Cl.
USPC .............. 438/149; 257/E21.703; 257/529

(58) Field of Classification Search
USPC .............. 257/529, 530, E21.415, E21.563, 257/E21.703; 365/225.7; 438/149
See application file for complete search history.

(56) References Cited

U.S. PATENT DOCUMENTS

| | | | |
|---|---|---|---|
| 6,087,690 A | 7/2000 | Chi | |
| 6,260,172 B1 | 7/2001 | Hazama | |
| 6,330,648 B1 | 12/2001 | Wambach et al. | |
| 6,438,059 B2 | 8/2002 | Akita et al. | |
| 6,821,857 B1 | 11/2004 | Khan et al. | |
| 7,080,001 B2 | 7/2006 | Moriyama et al. | |
| 7,115,950 B2 | 10/2006 | Tokushige | |
| 7,208,798 B2 | 4/2007 | Baba | |
| 7,394,708 B1 | 7/2008 | Vadi | |
| 7,479,418 B2 | 1/2009 | Cai et al. | |
| 7,514,766 B2 | 4/2009 | Yoshida | |
| 7,535,744 B2 | 5/2009 | Okuda | |
| 7,551,019 B2 | 6/2009 | Fujita et al. | |

(Continued)

FOREIGN PATENT DOCUMENTS

JP  2004207749  7/2004

OTHER PUBLICATIONS

"SOI-DRAM circuit technologies for low power high speed multigiga scale memories" bt Kuge, S.; Morishita, F.; Tsuruda, T.; Tomishima, S.; Tsukude, M.; Yamagata, T.; Arimoto, K.;Solid-State Circuits, IEEE Journal vol. 31, Issue: 4, Publication Year: 1996, pp. 586-591 Digital Object Identifier: 10.1109/4.499736.
"Optimal body bias selection for leakage improvement and process compensation over different technology generations" by Cassondra Neau, Kaushik Roy ISLPED '03: Proceedings of the 2003 international symposium on Low power electronics and design; Aug. 2003, pp. 116-121 ACM 1-58113-682-X/03/0008.

(Continued)

*Primary Examiner* — Thomas L Dickey
(74) *Attorney, Agent, or Firm* — Joan Pennington

(57) ABSTRACT

A method and an eFuse circuit for implementing with enhanced eFuse blow operation without requiring a separate high current and high voltage supply to blow the eFuse, and a design structure on which the subject circuit resides are provided. The eFuse circuit includes an eFuse connected to a field effect transistor (FET) operatively controlled during a sense mode and a blow mode for sensing and blowing the eFuse. The eFuse circuit is placed over an independently voltage controlled silicon region. During a sense mode, the independently voltage controlled silicon region is grounded providing an increased threshold voltage of the FET. During a blow mode, the independently voltage controlled silicon region is charged to a voltage supply potential. The threshold voltage of the FET is reduced by the charged independently voltage controlled silicon region for providing enhanced FET blow function.

12 Claims, 6 Drawing Sheets

U.S. PATENT DOCUMENTS

| | | | |
|---|---|---|---|
| 7,573,317 | B2 | 8/2009 | Lewis et al. |
| 7,629,233 | B2 | 12/2009 | Bernstein et al. |
| 7,675,317 | B2 | 3/2010 | Perisetty |
| 7,687,365 | B2 | 3/2010 | Sleight |
| 7,795,044 | B2 | 9/2010 | Wickramasinghe et al. |
| 2001/0026990 | A1 | 10/2001 | Christensen et al. |
| 2006/0234428 | A1* | 10/2006 | Furukawa et al. ............ 438/149 |
| 2007/0189051 | A1 | 8/2007 | Okuda |
| 2009/0108314 | A1 | 4/2009 | Cai et al. |
| 2009/0204777 | A1 | 8/2009 | Norman |
| 2009/0236683 | A1 | 9/2009 | Williams et al. |
| 2010/0067319 | A1* | 3/2010 | Aipperspach et al. ..... 365/225.7 |
| 2010/0133607 | A1 | 6/2010 | Mouli |
| 2010/0189262 | A1 | 7/2010 | Ducharme et al. |
| 2011/0018094 | A1 | 1/2011 | Chapman et al. |
| 2011/0122694 | A1 | 5/2011 | Modave et al. |

OTHER PUBLICATIONS

"Implementing Temporary Disable Function of Protected Circuitry by Modulating Threshold Voltage of Timing Sensitive Circuit" by Karl R. Erickson et al., U.S. Appl. No. 13/091,243, filed on the same day herewith.

"An Independently Voltage Controlled Volume of Silicon on a Silicon on Insulator Chip" by Karl R. Erickson et al., U.S. Appl. No. 13/091,275, filed on the same day herewith.

"eDRAM Having Dynamic Retention and Performance Tradeoff" by Karl R. Erickson et al., U.S. Appl. No. 13/091,292, filed on the same day herewith.

* cited by examiner

IMPLEMENTING EFUSE CIRCUIT WITH ENHANCED EFUSE BLOW OPERATION

FIELD OF THE INVENTION

The present invention relates generally to the data processing field, and more particularly, relates to a method and an eFuse circuit for implementing an enhanced eFuse blow operation without requiring a separate high current and high voltage supply to blow the eFuse, and a design structure on which the subject circuit resides.

DESCRIPTION OF THE RELATED ART

Electronic Fuses (eFuses) are currently used to configure elements after the silicon masking and fabrication process. Multiple eFuses typically are used, for example, to configure circuits for customization or to correct silicon manufacturing defects and increase manufacturing yield.

A first voltage supply, typically a common logic supply is used to sense the eFuse and in blowing the eFuse elements, a particular blow current and a high voltage eFuse blow supply is required. The two voltage supplies take up wiring and voltage generation resources. The regulators for the high voltage eFuse blow supply are a permanent board construction cost and add up quickly with large volume customers that need eFuse field programmability.

The first voltage supply and the second high voltage eFuse blow supply are used because the current required to blow the eFuse is much higher than the current allowed during the sense function. These requirements are different in order to guarantee eFuse resistance during the sense process.

A need exists for an alternative mechanism for efficiently and effectively implementing an eFuse circuit to eliminate the requirement for providing the additional high voltage eFuse blow supply.

As used in the following description and claims, it should be understood that the term eFuse means a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

SUMMARY OF THE INVENTION

Principal aspects of the present invention are to provide a method and an eFuse circuit for implementing enhanced eFuse blow operation without requiring a separate high current and high voltage supply to blow the eFuse, and a design structure on which the subject circuit resides. Other important aspects of the present invention are to provide such method, circuits and design structure substantially without negative effects and that overcome many of the disadvantages of prior art arrangements.

In brief, a method and an eFuse circuit for implementing with enhanced eFuse blow operation without requiring a semiconductor chip to include a separate high current and high voltage supply to blow the eFuse, and a design structure on which the subject circuit resides are provided. The eFuse circuit includes an eFuse connected to a field effect transistor (FET) operatively controlled during a sense mode and a blow mode for sensing and blowing the eFuse. The eFuse circuit is placed over an independently voltage controlled silicon region. During a sense mode, the independently voltage controlled silicon region is grounded providing a first threshold voltage of the FET. During a blow mode, the independently voltage controlled silicon region is charged to a voltage supply potential. The threshold voltage of the FET is reduced from the first threshold voltage by the charged independently voltage controlled silicon region, providing enhanced FET blow function.

In accordance with features of the invention, the independently voltage controlled silicon region is an isolated substrate region. The independently voltage controlled silicon region is created as a circuit element. Sides of the independently voltage controlled silicon region are formed with deep trench isolation, thereby insulating the independently voltage controlled silicon region on all sides. A bottom of the independently voltage controlled silicon region is created with a deep implant such as boron to create an N region when the substrate is doped P−. A buried oxide (BOX) region forms a top surface of the independently voltage controlled silicon region, thereby completing electrical isolation of the independently voltage controlled silicon region. An electrical contact for connecting the independently voltage controlled silicon region to the sense mode grounding input and the blow mode charging input signal, for example, is formed through the BOX region to the independently voltage controlled silicon region.

In accordance with features of the invention, a thinned buried oxide (BOX) region forming the top surface of the independently voltage controlled silicon region is provided for providing increased variation of threshold voltage of the FET between the sense mode and the blow mode.

In accordance with features of the invention, a threshold voltage control includes a time delay, for example set by a string of inverters, for applying the blow mode charging input signal to the independently voltage controlled silicon region.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1A:
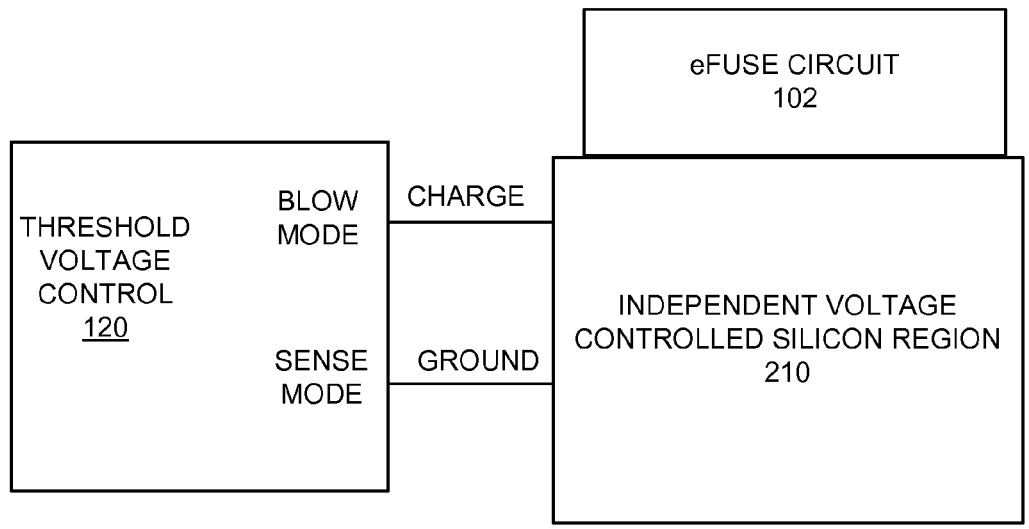
FIGS. 1A, 1B and 1C provide a schematic diagram illustrating an exemplary eFuse circuit for implementing enhanced eFuse blow operation in accordance with the preferred embodiment.
Figure 1B:
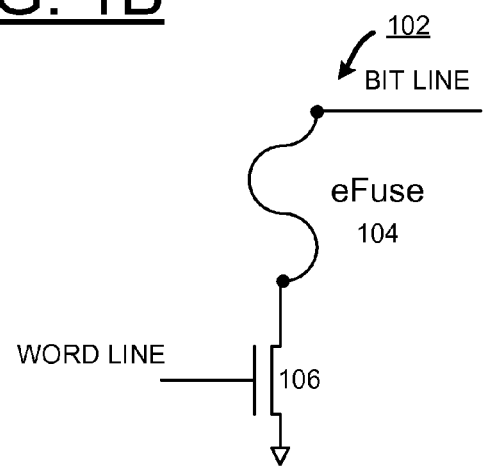
Figure 1C:
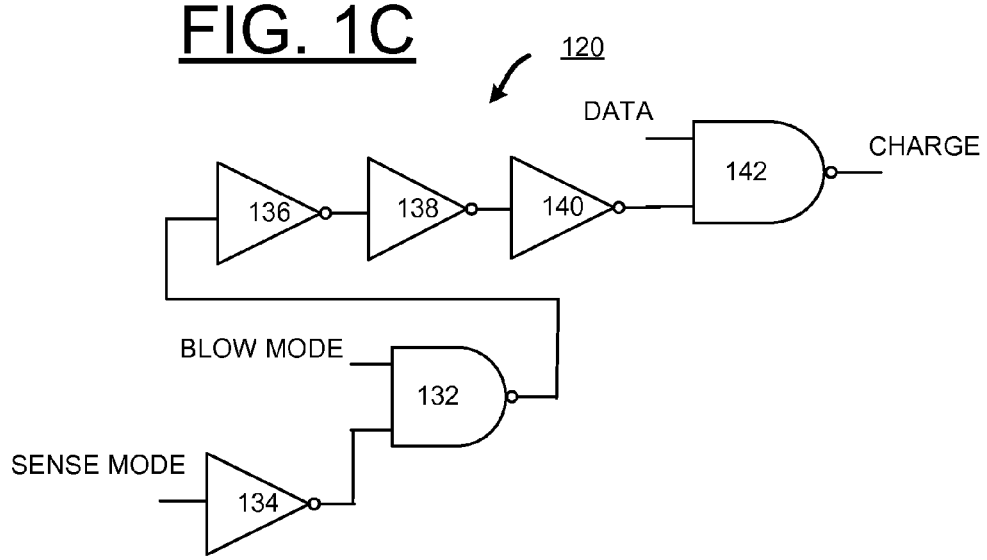

Having reference now to the drawings, in FIGS. 1A, 1B and 1C, there is shown an exemplary eFuse circuit for implementing enhanced eFuse blow operation generally designated by the reference character 100 in accordance with the preferred embodiment. The eFuse circuit 100 includes eFuse sense and blow circuitry 102 placed over an independently voltage controlled silicon region 210 of a semiconductor chip 200.

Figure 2A:
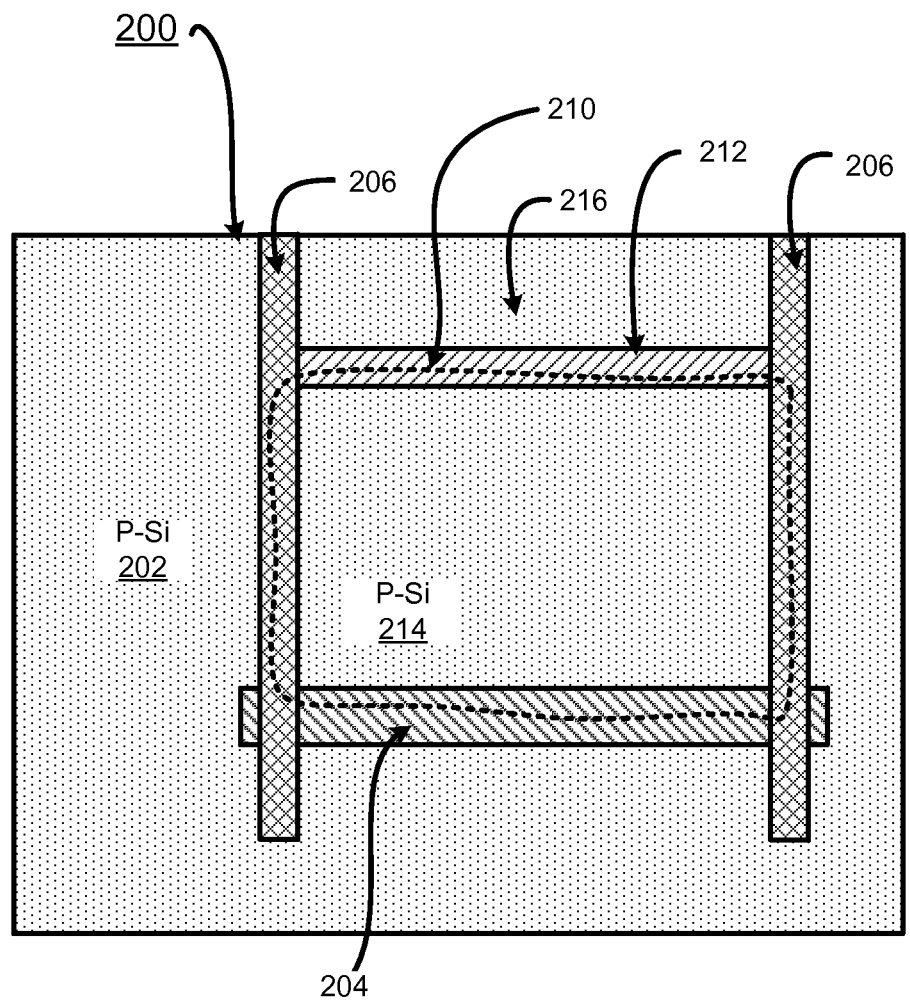
FIGS. 2A, 2B and 2C illustrates example views of exemplary processing steps of an example semiconductor chip of a sense/blow field effect transistor (FET) of the eFuse circuit of FIG. 1 in accordance with a preferred embodiment.
Figure 2B:
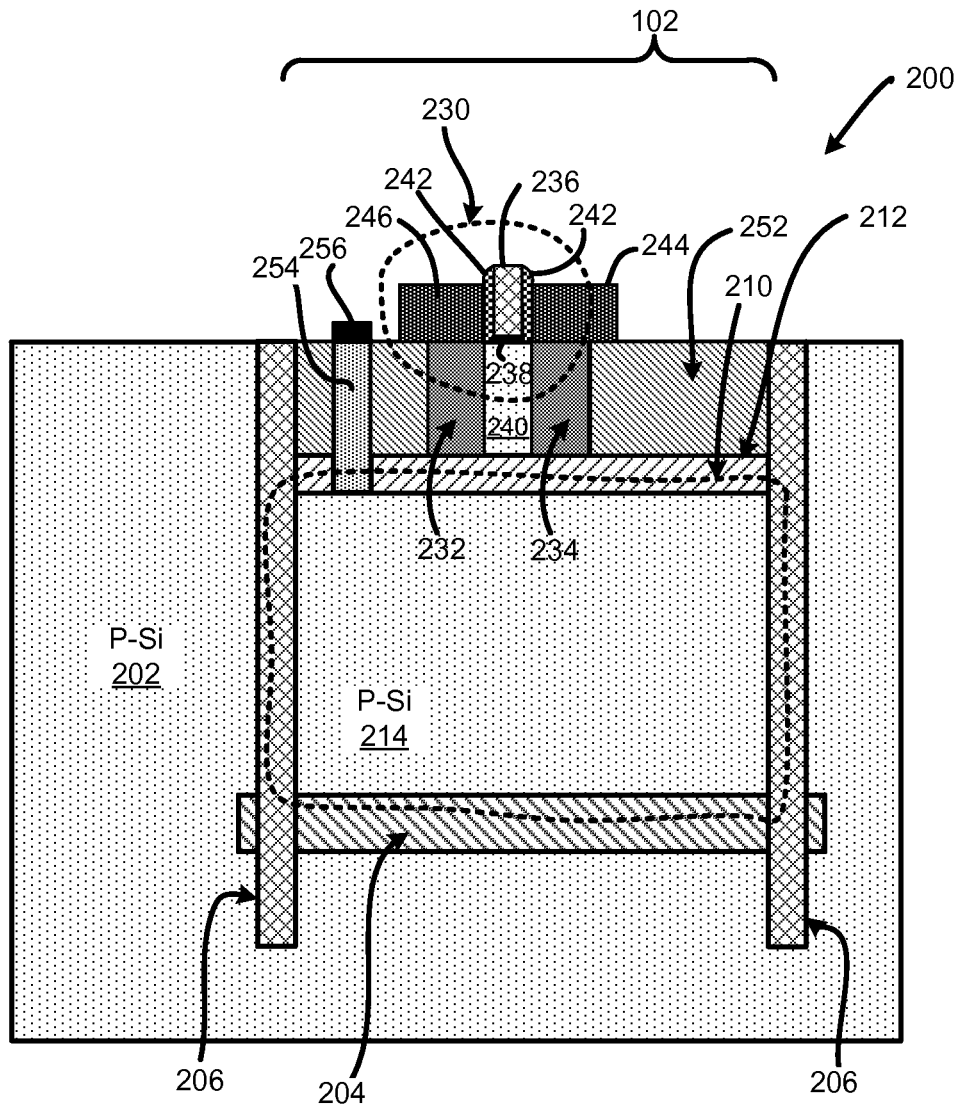
Figure 2C:
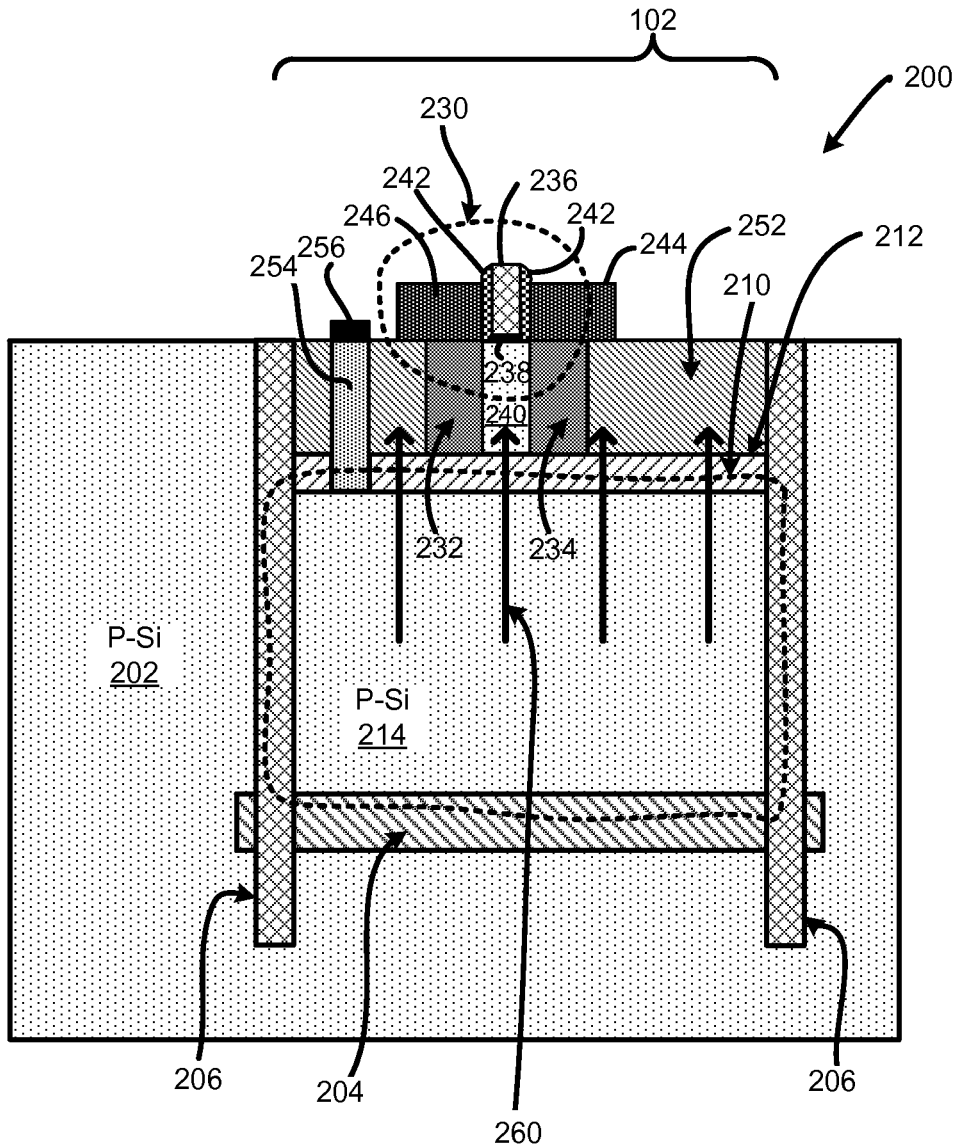

An exemplary semiconductor silicon on insulator (SOI) chip 200 at example processing steps are illustrated and described with respect to FIGS. 2A, 2B, and 2C for implementing the eFuse circuit 100 having the enhanced eFuse blow operation.

In accordance with features of the invention, the independent voltage controlled silicon region 210 is an electrically isolated island of conductive substrate. This isolation of region 210 provides a noiseless, isolated substrate for the eFuse circuitry 102. The independent voltage controlled silicon region 210 efficiently and effectively changes the device threshold voltage of the eFuse circuitry 102 during a sense mode and a blow mode for sensing and blowing the eFuse, responsive to a varied voltage potential of the independent voltage controlled silicon region controlled by the threshold voltage control 120.

The eFuse circuitry 102 includes an eFuse 104 is connected to a field effect transistor (FET) 106 operatively controlled during a sense mode and a blow mode for sensing and blowing the eFuse 104.

As shown in FIG. 1B, an N-channel (NFET) 106 is connected between the eFuse and a BIT LINE rail, with a WORD LINE connection to the gate of the NFET.

During a sense mode, the independently voltage controlled silicon region 210 is grounded by the threshold voltage control 120 with a ground input applied for providing a first threshold voltage of the FET 106.

During a blow mode, the independently voltage controlled silicon region 210 is charged to a voltage supply potential with a charging input applied by the threshold voltage control 120. During the blow mode, the threshold voltage of the NFET 106 is reduced from the first threshold voltage responsive to the charged independently voltage controlled silicon region 210, providing enhanced FET blow function.

Referring to FIG. 1C, the threshold voltage control 120 includes charging circuitry including a NAND gate 132 receiving a blow mode input and an inverted sense mode input applied by an inverter 134. The output of NAND gate 132 is applied by a time delay string of inverters 136, 138, 140 to an input of an output NAND gate 142. A data signal is applied to the other input of the output NAND gate 142. The output NAND gate provides an output labeled CHARGE for charging the independently voltage controlled silicon region 210 during the blow function. The charging circuitry 120 is activated as the blow function begins, allowing the current to slowly build. The charging circuitry 120 allows a separate current source (not shown) to preheat the link of eFuse 106 as required for some eFuses before the blow current builds to true electro-migration levels.

The independently voltage controlled silicon region 210 is discharged, with a grounding input applied by the threshold voltage control 120 substrate before the sense function starts. This prevents potential damage to the eFuse 104 during the sense operation.

Referring first to FIG. 2A, there is shown the exemplary semiconductor silicon on insulator (SOI) chip 200 for implementing the eFuse circuit 100 including initial processing steps to create the independently voltage controlled silicon region 210 indicated by dotted line. As shown, the SOI chip has a substrate 202 is typically P− doped silicon, although substrates of opposite (i.e., N−) are also known.

As shown in FIG. 2A, the independently voltage controlled silicon region 210 is an isolated substrate region formed in the chip P− Si substrate 202. The independently voltage controlled silicon region 210 in the SOI chip 200 provides the circuit element 210 changing the threshold voltage of NFET 106 of the eFuse circuitry 102 illustrated in the eFuse circuit 100.

As shown in FIG. 2A, a bottom of the independently voltage controlled silicon region 210 is created with a deep implant 204 such as a boron implant to create a deep N implant with the P− Si substrate 202. The deep implant 204 has opposite doping to a substrate doping of the semiconductor chip 200 including a boron implant to create an N region when the substrate doping of the semiconductor chip is doped P−. The semiconductor chip 100 receives high energy boron implant through a mask (not shown), thereby creating the deep N implant 204 at a depth determined by implant energy and semiconductor structure. For example, a 4 MeV boron implant is provided to create the deep N implant 204 approximately 20 um below a top surface of semiconductor chip 200.

As shown in FIG. 2A, a deep trench isolation 206 extending below the deep N implant 204 forms each side 206 of the independently voltage controlled silicon region 210, thereby insulating the independently voltage controlled silicon region on all sides. The deep trench isolation 206 forms the four sides of the square or rectangular independently voltage controlled silicon region 210. The deep trench isolation 206 may be created using a conventional process such as used to create embedded dynamic random access memory (eDRAM) capacitors, and is elongated to form sides of the independently voltage controlled silicon region 210. A buried oxide (BOX) layer or region 212 forms a top surface of the independently voltage controlled silicon region 210, thereby completing electrical isolation of the independently voltage controlled silicon region. The BOX region 212 is created by a conventional oxygen implant applied to semiconductor chip 200 at a depth determined by energy of the oxygen implant.

Following construction of the deep N implant 204, trench isolation 206, and BOX 212, the P− Si 214 within the independently voltage controlled silicon region 210 is totally isolated electrically. P− Si 214 is merely an electrically isolated portion of P− Si substrate 202 and does not receive a separate implant. The BOX region 212 provides an electric insulator under a P− Si substrate 216 that is an upper electrically isolated portion of P− Si substrate 202.

Referring first to FIG. 2B, there is shown the exemplary semiconductor silicon on insulator (SOI) chip 200 for implementing a sense/blow field effect transistor (FET) of the eFuse circuit 100 after further processing steps to create the eFuse circuitry 102 above the independently voltage controlled silicon region 210.

A single field effect transistor (FET) 230 such as an N-channel or NFET is shown in the area for eFuse circuitry 102, however it will be appreciated that a large number of NFETs 230 can be placed in this area. NFET 230 includes a source 232, a drain 234, a gate 236, a gate dielectric 238, a body 240, sidewall spacers 242, and optional epitaxial growths 244 and 246. The optional epitaxial growths 244 and 246 are used to couple the adjacent source 232 and drain 234, to make electrical contact with deep trench embedded dynamic random access memory (eDRAM) if used on the semiconductor chip. NFET 230 is formed by conventional processes in silicon 216 in a conventional manner.

An electrical contacting structure 254 is formed by etching through a STI (shallow trench isolation) 252 and through BOX layer 212 and filled with a conductor such as tungsten or doped polysilicon, for example, to make electrical connection to P− Si 214 for connecting the independently voltage controlled silicon region 210 to the blow mode charging input signal and the sense mode ground input of the threshold voltage control 120.

Contacting structure 254 may have a contact 256 to connect to the threshold voltage control 120. The shallow trench isolation (STI) 252, as shown in the finely crosshatched portions with crosshatching running up and to the left, is formed in silicon 216 that is the portion of P− Si 102 above BOX layer 212.

It should be understood that alternatively an electrical contact for connecting the independently voltage controlled silicon region 210 to the blow mode charging input signal and the sense mode ground input of the threshold voltage control 120 can be formed through the deep N implant 206 and the silicon substrate 202 below the independently voltage controlled silicon region.

In accordance with features of the invention, an electric field from the isolated independently voltage controlled silicon region 210 extends through the buried oxide 212 for selectively lowering the threshold voltage of the NFET 106 during the fuse blow mode.

Referring first to FIG. 2C, there is shown the exemplary semiconductor silicon on insulator (SOI) chip 200 following the processing steps of FIG. 2B with an electric field indicated by multiple arrows 260 responsive to the to the blow mode charging input signal of the threshold voltage control 120 applied to the independently voltage controlled silicon region 210.

Figure 3:
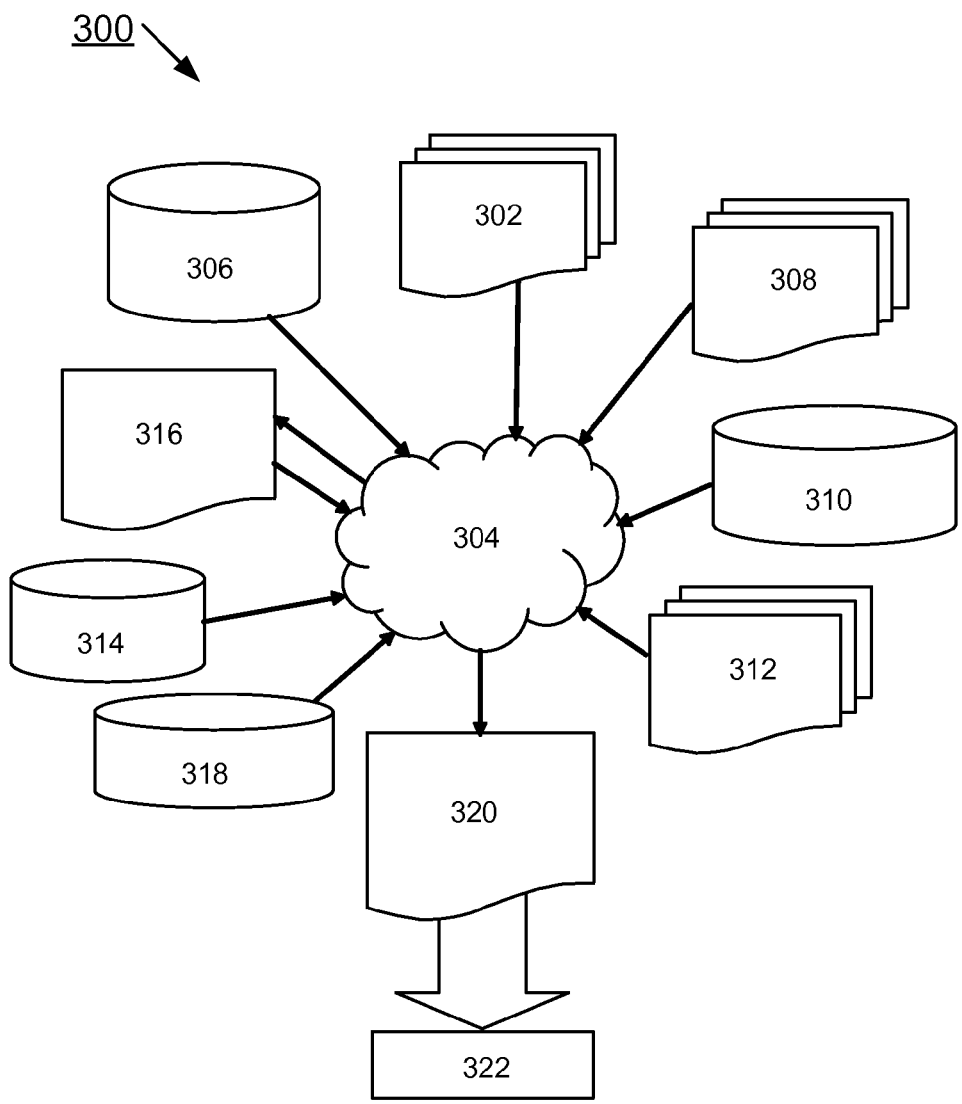
FIG. 3 is a flow diagram of a design process used in semiconductor design, manufacturing, and/or test.

FIG. 3 shows a block diagram of an example design flow 300. Design flow 300 may vary depending on the type of IC being designed. For example, a design flow 300 for building an application specific IC (ASIC) may differ from a design flow 300 for designing a standard component. Design structure 302 is preferably an input to a design process 304 and may come from an IP provider, a core developer, or other design company or may be generated by the operator of the design flow, or from other sources. Design structure 302 comprises circuit 100, in the form of schematics or HDL, a hardware-description language, for example, Verilog, VHDL, C, and the like. Design structure 302 may be contained on one or more machine readable medium. For example, design structure 302 may be a text file or a graphical representation of circuit 100. Design process 304 preferably synthesizes, or translates, circuit 100, into a netlist 306, where netlist 306 is, for example, a list of wires, transistors, logic gates, control circuits, I/O, models, etc. that describes the connections to other elements and circuits in an integrated circuit design and recorded on at least one of machine readable medium. This may be an iterative process in which netlist 306 is resynthesized one or more times depending on design specifications and parameters for the circuit.

Design process 304 may include using a variety of inputs; for example, inputs from library elements 308 which may house a set of commonly used elements, circuits, and devices, including models, layouts, and symbolic representations, for a given manufacturing technology, such as different technology nodes, 32 nm, 45 nm, 90 nm, and the like, design specifications 310, characterization data 312, verification data 314, design rules 316, and test data files 318, which may include test patterns and other testing information. Design process 304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 304 without deviating from the scope and spirit of the invention. The design structure of the invention is not limited to any specific design flow.

Design process 304 preferably translates an embodiment of the invention as shown in FIGS. 1A, 1B, 1C, 2A, 2B, and 2C along with any additional integrated circuit design or data (if applicable), into a second design structure 320. Design structure 320 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, 1C, 2A, 2B, and 2C. Design structure 320 may then proceed to a stage 322 where, for example, design structure 320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. An eFuse circuit for implementing enhanced eFuse blow operation comprising:
    an independently voltage controlled isolated silicon region;
    eFuse circuitry disposed above said independently voltage controlled silicon region; said eFuse circuitry including an eFuse and a field effect transistor (FET) connected to the eFuse operatively controlled during a sense mode and a blow mode for sensing and blowing the eFuse; and
    a threshold voltage control function controlling a voltage potential of said independently voltage controlled isolated silicon region; said threshold voltage control function including a time delay string of inverters activated responsive to the blow mode; said threshold voltage control function applying a grounding input signal to said independently voltage controlled silicon region during the sense mode providing a first threshold voltage of the FET; and applying a charging input signal to said independently voltage controlled silicon region during the blow mode providing a second reduced threshold voltage of the FET, providing enhanced FET blow function.

2. The circuit as recited in claim 1 wherein said eFuse circuitry includes an N-channel (NFET).

3. The circuit as recited in claim 1 includes a semiconductor silicon on insulator (SOI) chip including said independently voltage controlled silicon region and said eFuse circuitry.

4. The circuit as recited in claim 3 wherein said independently voltage controlled silicon region is created as a circuit element including sides formed with deep trench isolation, insulating the independently voltage controlled silicon region on each side.

5. The circuit as recited in claim 4 wherein said independently voltage controlled silicon region includes a bottom created with a deep implant of opposite doping to a substrate doping of the semiconductor chip.

6. The circuit as recited in claim 4 wherein said independently voltage controlled silicon region includes a buried oxide (BOX) implant forming a top surface of the independently voltage controlled silicon region.

7. The circuit as recited in claim 1 includes a contact structure of electrically conducting material for connecting said independently voltage controlled silicon region to a sense mode input grounding signal and the blow mode charging input signal to said independently voltage controlled silicon region.

8. A method for implementing enhanced eFuse blow operation of an eFuse circuit comprising:

provide an independently voltage controlled isolated silicon region;

providing eFuse circuitry disposed above said independently voltage controlled silicon region; said eFuse circuitry including an eFuse and a field effect transistor (FET) connected to the eFuse operatively controlled during a sense mode and a blow mode for sensing and blowing the eFuse; and controlling a voltage potential of said independently voltage controlled isolated silicon region with a threshold voltage control function; said threshold voltage control function applying a grounding input signal to said independently voltage controlled silicon region during the sense mode providing a first threshold voltage of the FET; and applying a charging input signal to said independently voltage controlled silicon region during the blow mode providing a second reduced threshold voltage of the FET, providing enhanced FET blow function.

9. The method as recited in claim 8 wherein controlling a voltage potential of said independently voltage controlled isolated silicon region with a threshold voltage control function includes providing said threshold voltage control function with a time delay function activated responsive to the blow mode.

10. The method as recited in claim 8 wherein providing an independently voltage controlled isolated silicon region includes creating said independently voltage controlled silicon region as a circuit element in a semiconductor silicon on insulator (SOI) chip and forming sides of said independently voltage controlled silicon region with deep trench isolation, insulating said independently voltage controlled silicon region on each side.

11. The method as recited in claim 10 includes forming a bottom of said independently voltage controlled silicon region with a deep implant of opposite doping to a substrate doping of the semiconductor SOI chip.

12. The method as recited in claim 10 includes forming a top of the independently voltage controlled silicon region with a buried oxide (BOX) implant.

* * * * *